(12) United States Patent
Bayerer

(10) Patent No.: US 9,355,950 B1
(45) Date of Patent: May 31, 2016

(54) POWER SEMICONDUCTOR MODULE HAVING LOW GATE DRIVE INDUCTANCE FLEXIBLE BOARD CONNECTION

(71) Applicant: Infineon Technologies AG, Neubiberg (DE)

(72) Inventor: Reinhold Bayerer, Reichelsheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/592,244

(22) Filed: Jan. 8, 2015

(51) Int. Cl.
*H01L 23/49* (2006.01)
*H01L 23/498* (2006.01)
*H01L 23/00* (2006.01)
*H01L 25/16* (2006.01)

(52) U.S. Cl.
CPC ...... *H01L 23/49833* (2013.01); *H01L 23/4985* (2013.01); *H01L 23/49844* (2013.01); *H01L 24/32* (2013.01); *H01L 24/41* (2013.01); *H01L 24/49* (2013.01); *H01L 24/73* (2013.01); *H01L 24/83* (2013.01); *H01L 24/84* (2013.01); *H01L 24/85* (2013.01); *H01L 24/92* (2013.01); *H01L 25/16* (2013.01); *H01L 2224/32225* (2013.01); *H01L 2224/40227* (2013.01); *H01L 2224/48227* (2013.01); *H01L 2224/73263* (2013.01); *H01L 2224/73265* (2013.01); *H01L 2224/84801* (2013.01); *H01L 2224/85801* (2013.01); *H01L 2224/92246* (2013.01); *H01L 2224/92247* (2013.01); *H01L 2924/13055* (2013.01); *H01L 2924/13091* (2013.01); *H01L 2924/1426* (2013.01)

(58) Field of Classification Search
CPC ... H01L 23/49833; H01L 24/73; H01L 24/49; H01L 24/32; H01L 25/16; H01L 24/83; H01L 23/4985; H01L 24/84; H01L 24/41; H01L 24/92; H01L 23/49844; H01L 24/85; H01L 2224/73263; H01L 2224/48227
See application file for complete search history.

(56) References Cited

U.S. PATENT DOCUMENTS

| 7,791,208 B2 | 9/2010 | Bayerer | |
|---|---|---|---|
| 2009/0085219 A1* | 4/2009 | Bayerer | H01L 24/48 257/776 |
| 2013/0093046 A1 | 4/2013 | Bayerer et al. | |

OTHER PUBLICATIONS

Bayerer, et al., "Low Impedance Gate Drive for full Control of Voltage Controlled Power Devices", Power Semiconductor Devices & IC's (ISPSD), 2014 IEEE 26th International Symposium on Jun. 15-19, 2014, 438-441.
Bayerer, et al., "Power Circuit design for clean switching", Integrated Power Electronics Systems (CIPS), 2010 6th International Conference on Mar. 16-18, 2010, 1-6.

* cited by examiner

*Primary Examiner* — Roy Potter
*Assistant Examiner* — Paul Patton
(74) *Attorney, Agent, or Firm* — Murphy, Bilak & Homiller, PLLC

(57) ABSTRACT

A power semiconductor module includes a metallization layer and a power semiconductor die attached to the metallization layer. The die has a first terminal and a second terminal disposed at a side of the die facing away from the metallization layer. The power semiconductor module further includes a first interconnect attached to the first terminal, a second interconnect attached to the second terminal and a flexible board including a first metal layer, a second metal layer and an insulator between the first and the second metal layers so that the first and the second metal layers are electrically insulated from one another. The first metal layer is attached to the first interconnect and the second metal layer is attached to the second interconnect such that the flexible board is spaced apart from the power semiconductor die by the first and the second interconnects.

21 Claims, 12 Drawing Sheets

POWER SEMICONDUCTOR MODULE HAVING LOW GATE DRIVE INDUCTANCE FLEXIBLE BOARD CONNECTION

TECHNICAL FIELD

The present application relates to power semiconductor modules, in particular power semiconductor modules having a low gate drive inductance.

BACKGROUND

In power electronic circuits such as inverters, converters, etc., power semiconductor switches such as MOSFETs (metal oxide semiconductor field effect transistors), IGBTs (insulated gate bipolar transistors), and JFETs (junction field effect transistors) are controlled through a control electrode such as a gate electrode for MOSFETs, gate electrode for IGBTs, base current electrode for bipolar transistors, etc. Commands for controlling turn-on, turn-off, blocking and conducting states of the power semiconductor switches are generated in a controller and transferred to the control terminal by gate drivers for each power switch. The gate drivers shift the command signals from the controller input voltage (e.g. via a transformer, opto-coupler, level-shifter, etc.) and shape the drive signals for intended switching transitions (slope, rise and fall time, delay time, etc).

Power semiconductor devices as mentioned above can also be used to manage fault conditions e.g. by detecting short circuit of loads. A load short circuit can occur between two phases, all three phases or between one or more phases to ground. Under such short circuit conditions the output characteristics of the power semiconductors are utilized. For example, the drain (collector) current i.e. the current between the power terminals of the power semiconductor device saturates at about 4 to 10 times the rated current, whereas the saturation level is determined by the amount of gate voltage and the transfer characteristic of the device. Power semiconductors can withstand such high current conditions at high voltage for only few µs. The driver or controller senses such conditions quickly and turns off the power semiconductor device. Different types of short circuit conditions may arise. In each case, the characteristic di/dt and dV/dt response of the power circuit causes gate overvoltage conditions which arise because of the stray inductance seen at the gate input of the device. This stray inductance, generally referred to herein as the gate circuit inductance, includes the inductance associated with wiring on the board of the gate driver (board layout), the wiring from the gate driver to the control terminals of the power module, and terminals, wires and conductor paths inside the power module to the power transistor gates. The height of the gate overvoltage depends in part on the gate circuit inductance. In other words the speed at which charge at the gate can flow into the voltage source of the driver is not only limited by the resistance of the gate circuit, but also by the inductance. The gate circuit inductance limits the speed by which gate current can change. Therefore, for typical gate circuits, gate over voltages can exceed 20 V which is normally the maximum rating.

Also in modules for higher power chips which are paralleled together, the common gate requires a more powerful gate driver. Within the gate driver this is usually achieved by the use of transistors having higher current ratings and lower gate resistors. The wiring on the board of the gate driver (board layout), the wiring from the gate driver to the control terminals of the power module, and terminals, wires and conductor paths inside the power module to the gates of the paralleled devices remains similar as in the single transistor case. This yields a gate circuit inductance which is about the same as in the single transistor case. The current out of the common gate scales up with the number of devices in parallel. The di/dt of the gate current also scales up, accordingly, which causes higher overvoltage at the gate. The gate circuit inductance is a function of the geometry in the driver circuit and the connections to the power transistor module. A lower gate circuit inductance improves short circuit response which aids in quickly limiting the gate voltage to the value set by the driver and consequently limiting short circuit current at a load followed by a controlled turn-off of the short circuit (the main problem with high inductance in the gate circuit is the increase of gate voltage during a short circuit condition). A lower gate circuit inductance also improves the turn-on and turn-off response of power transistor devices, providing a faster device response time. Gate circuit inductance is conventionally overlooked in favor of resistive impedance. Gate circuit inductance has been addressed by the assembly of gate driver boards directly onto power module terminals without wiring in between. The inductance on the gate driver board and inside the power modules or packages is not typically addressed.

SUMMARY

According to an embodiment of a power semiconductor module, the module comprises a metallization layer and a power semiconductor die attached to the metallization layer. The power semiconductor die has a first terminal and a second terminal disposed at a side of the die facing away from the metallization layer. The power semiconductor module further comprises a first interconnect attached to the first terminal, a second interconnect attached to the second terminal and a flexible board comprising a first metal layer, a second metal layer and an insulator between the first and the second metal layers so that the first and the second metal layers are electrically insulated from one another. The first metal layer is attached to the first interconnect and the second metal layer is attached to the second interconnect such that the flexible board is spaced apart from the power semiconductor die by the first and the second interconnects.

According to another embodiment of a power semiconductor module, the module comprises a patterned metallization layer having a plurality of sections separated from one another and a plurality of power semiconductor dies attached at least to a first one of the sections of the metallization layer and each having a first terminal and a second terminal disposed at a side of the die facing away from the patterned metallization layer. The power semiconductor module further comprises first interconnects attached to the first terminal of the power semiconductor dies, second interconnects attached to the second terminal of the power semiconductor dies and a flexible board comprising a first metal layer, a second metal layer and an insulator between the first and the second metal layers so that the first and the second metal layers are electrically insulated from one another. The first metal layer is attached to the first interconnects and the second metal layer is attached to the second interconnects such that the flexible board is spaced apart from the power semiconductor dies by the first and the second interconnects.

According to an embodiment of a method of manufacturing a power semiconductor module, the method comprises: attaching a power semiconductor die to a metallization layer, the power semiconductor die having a first terminal and a second terminal disposed at a side of the die facing away from the metallization layer; attaching a first interconnect to the first terminal and a second interconnect to the second terminal; providing a flexible board that comprises a first metal layer, a second metal layer and an insulator between the first and the second metal layers so that the first and the second metal layers are electrically insulated from one another; and attaching the first metal layer to the first interconnect and the second metal layer to the second interconnect such that the flexible board is spaced apart from the power semiconductor die by the first and the second interconnects.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

According to embodiments described herein, a power semiconductor module includes one or more power semiconductor dies (chips) assembled on a power board such as a DCB (direct copper bonded), AMB (active metal brazed), or DAB (direct aluminum bonded) substrate, printed circuit board (PCB) or lead frame. Upper side interconnects to each power semiconductor die (e.g. emitter, anode, cathode, source, gate) are in the form of bonded aluminum or copper wires, aluminum or copper ribbons or metal clips. Joining methods such as sintering, diffusion soldering, brazing, ultrasonic bonding, laser welding, or electron beam welding (EBW) can be used to attach (join) the interconnects to the upper side terminals of the die(s).

A flexible board comprising an insulator and metallization on both sides forms a parallel plate wave guide (sometimes also regarded as strip line) for an external gate drive circuit which controls switching of the die(s) included in the power semiconductor module. The flexible board is connected to the interconnects which are joined to the upper side terminals of the power semiconductor die(s). One metallization layer of the flexible board connects to the control terminals and at least a second metallization layer of the flexible board connects to the emitter/source reference terminals for the drive signal of the power semiconductor. The flexible board can protrude out of the module and make contact to the external gate drive circuit to realize a parallel plate wave guide design from the gate drive circuit to the power semiconductor die(s) inside the module. The driver circuit/electronics can also be integrated on the flexible board, so that the flexible board serves as a bus for the upper side interconnects, carrier of the driver circuit and interface to the controller or any external communication means.

In general, the flexible board provides the wiring of the control circuit, e.g. gates and emitters/sources in power semiconductor modules. The flexible board is connected to the module interconnects which are bonded to the upper side terminals of the power semiconductor die(s) prior to joining the flexible board. As such, the flexible board is positioned at an elevated level above the power semiconductor die(s) and can be placed at the same height in the module as the interconnects (e.g. wires, ribbons or clips) attached to the upper side terminals of the power semiconductor die(s). This way, the flexible board is spaced apart from each power semiconductor die by the interconnects attached to the upper side die terminals.

Figure 1:
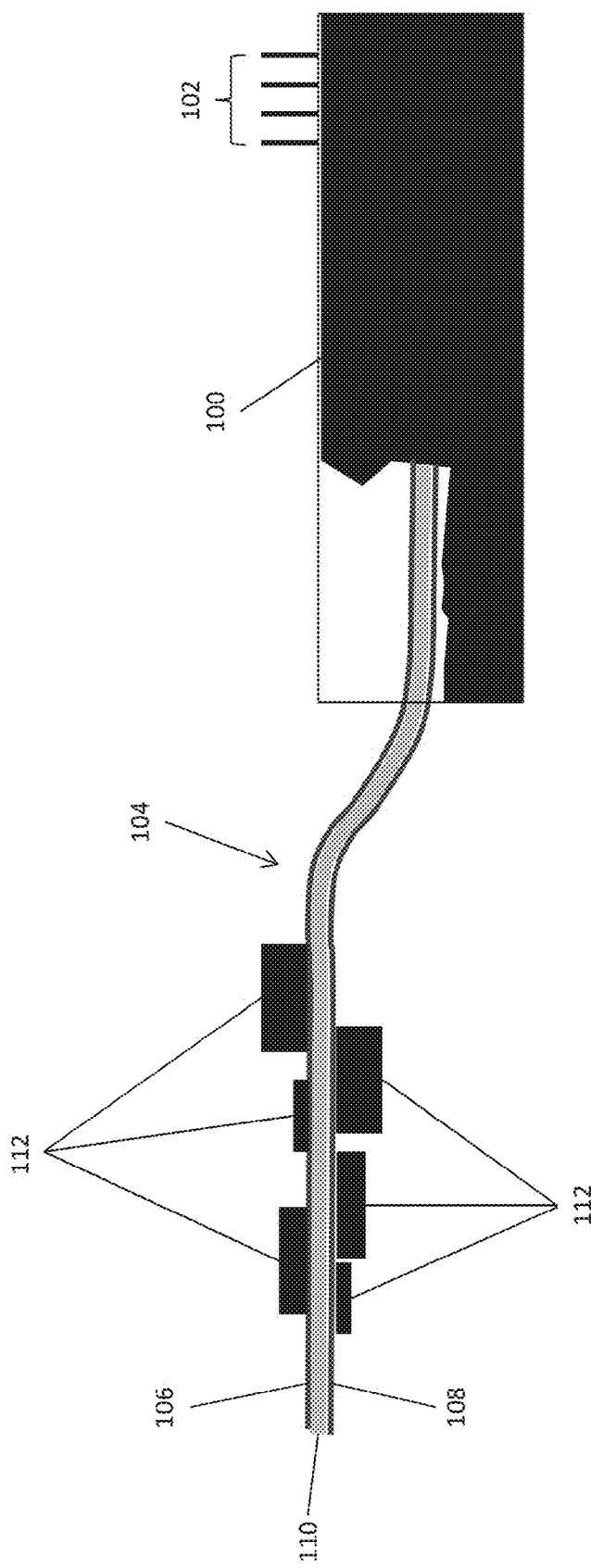
FIG. 1 illustrates a side view of an embodiment of a power semiconductor module having a low gate drive inductance flexible board connection.

FIG. 1 illustrates an embodiment of a power semiconductor module. The power semiconductor module comprises an enclosure 100 such as a plastic or metal housing with power terminals 102 protruding out of the housing 100. The power terminals 102 provide external power connections for each power semiconductor die (not shown in FIG. 1) included in the housing 100. Each power semiconductor die is attached to a power board (also not shown in FIG. 1) such as a DCB, AMB or DAB substrate, a PCB, or a lead frame. The power semiconductor module also comprises a flexible board 104 which protrudes out of the housing 100.

The flexible board 104 includes a first (upper) metal layer 106, a second (lower) metal layer 108 and an insulator 110 between the first and the second metal layers 106, 108 so that the first and second metal layers 106, 108 are electrically insulated from one another. The insulator 110 can be e.g. polyimide and an adhesive can be applied to the metal layers 106, 108. The metal layers 106, 108 can comprise e.g. copper or aluminum. The thickness of the insulator 110 can range from 25 µm to 100 µm for easy bending. The thickness of the metal layers 106, 108 can range from 17 µm to 100 µm for easy bending. The first and second metal layers 106, 108 can have the same or different thicknesses. The flexible board 104 can be a multi-layered flexible board for receiving sensor signals, auxiliary emitter or other signals, etc., in addition to the control signals, i.e. gate circuit. The flexible board 104 can have cutouts and/or be shaped to serve as a stress relief mechanism within the power semiconductor module.

The flexible board 104 forms a parallel plate wave guide from an external driver circuit to the power semiconductor dies inside the module. One or more of the semiconductor dies and/or passive components 112 that form the external driver circuit can be attached to a section of the flexible board 104 which protrudes out of the housing 100 as shown in FIG. 1. In this case, the flexible board 104 serves as a bus, carrier of the driver circuit and interface to a controller or any external communication means. Alternatively or in addition, one or more of the driver circuit dies and/or passive components 112 can be disposed in another housing or attached to another board separate from the flexible board 104 and the power semiconductor module 100. In each case, the flexible board 104 provides an electrical connection pathway between the external driver circuit and the power semiconductor module and presents low gate inductance to the power semiconductor die(s) included in the power semiconductor module. Part of the housing 100 is cut-away in FIG. 1 to show the flexible board 104 extending inside the housing 100.

Upper side terminals of each power semiconductor die within the housing are attached to interconnects (not shown in FIG. 1) within the housing 100 such as bond wires, bond ribbons or metal clips. The upper metal layer 106 of the flexible board 104 is attached to first one(s) of the interconnects, and the lower metal layer 108 of the flexible board 104 is attached to second one(s) of the interconnects. This way, the flexible board 104 is spaced apart from each power semiconductor die included in the housing 100 by the interconnects attached to the top side terminals of the die(s). This way, the power semiconductor module can be assembled using any standard die interconnection process whereby interconnects such as bond wires, bond ribbons or metal clips are attached to the top side terminals of each power semiconductor die within the housing 100 before the flexible board 104 is attached to the interconnects. The metal layers 106, 108 of the flexible board 104 can be attached to the corresponding interconnects using any standard joining technology such as ultrasonic bonding, sintering, diffusion soldering, brazing, laser welding, EBW, etc.

Figure 2:
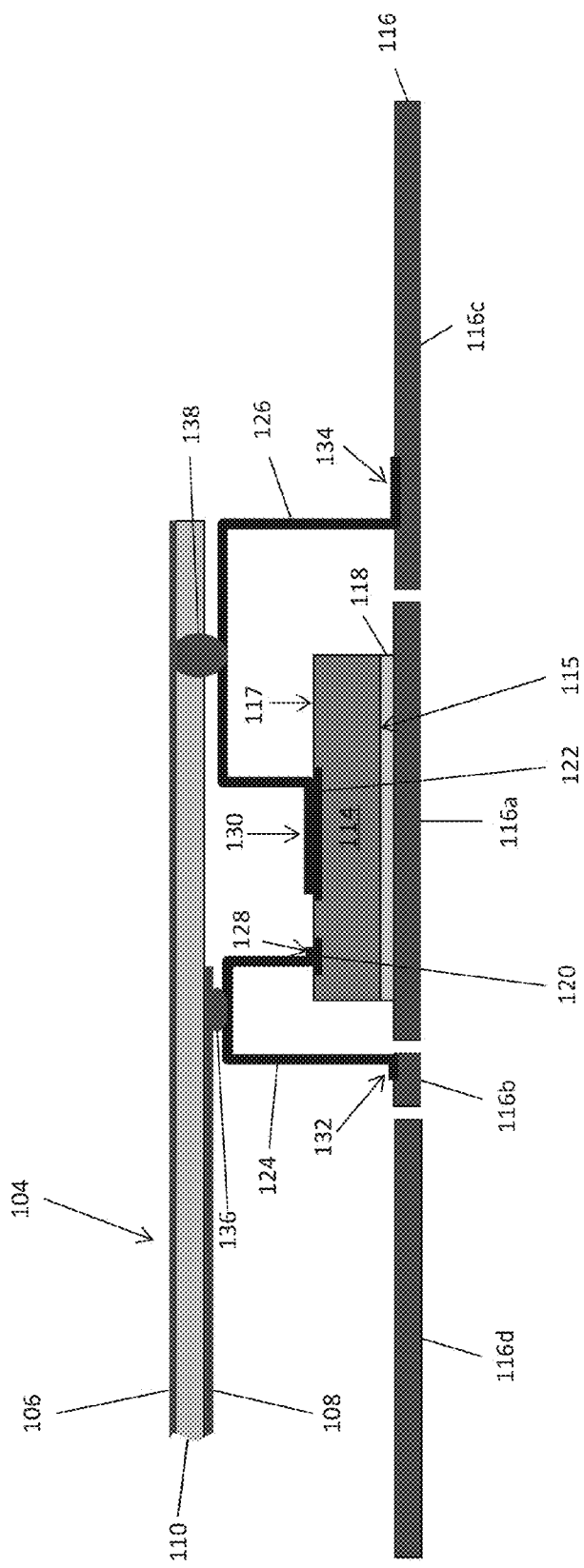
FIGS. 2 through 6 illustrate sectional views of a low gate drive inductance flexible board connection for power semiconductor modules according to different embodiments.

FIG. 2 illustrates a partial sectional view of the power semiconductor module with the housing 100 removed. A single power semiconductor die 114 is shown in FIG. 2 for ease of illustration. The power semiconductor module can include one or more power semiconductor dies 114, depending on the type of module. In addition, only the uppermost metallization layer 116 of the power board to which the die 114 is attached is shown in FIG. 2 also for ease of illustration.

In one embodiment, the uppermost metallization layer 116 of the power board is patterned into a plurality of sections 116a, 116b, 116c separated from one another. The bottom side 115 of the power semiconductor die 114 is attached to a first section 116a of the metallization layer 116 via a die attach material 118 such as solder, diffusion soldering, sintering, adhesive, etc. In the case of a vertical device in which the current flow direction is between the bottom and top sides 115, 117 of the die 114, the bottom side 115 of the die 114 can be a power terminal such as the drain of a power MOSFET, collector of an IGBT or anode/cathode of a power diode. The power terminal is attached e.g. by diffusion soldering to the first section 116a of the uppermost metallization layer 116 of the power board. In the case of a lateral device in which the current flow direction is horizontal, the bottom side 115 of the die 114 is not active. The respective drain or collector terminal of such a device would have interconnects on the top side, as well. The flexible board 104 would then still connect the source and gate terminal or equivalent control terminals on top of the power semiconductor 114.

In the case of either device type, the power semiconductor die 114 also has one or more top side terminals 120, 122 which face away from the uppermost metallization layer 116 of the power board. For example in the case of a power MOSFET, the die 114 can have a control or gate terminal 120 and a source terminal 122 at the side 117 of the die 115 facing away from the metallization layer 116. In the case of an IGBT, the die 114 can have a control or gate terminal 120 and an emitter terminal 122 at the side 117 of the die 114 facing away from the metallization layer 116. In the case of a power diode, the die 114 can have a cathode or anode terminal 122 at the side 117 of the die 114 facing away from the metallization layer 116. FIG. 2 shows a power transistor such as a power MOSFET or IGBT with top side control/gate and source/emitter terminals 120, 122, but could be a power diode by eliminating the gate terminal 120.

A first interconnect 124 such as a bond wire, bond ribbon or metal clip is attached to the control or gate terminal 120 of the power semiconductor die 114. A second interconnect 126 such as a bond wire, bond ribbon or metal clip is attached to the other (source/emitter) top side terminal 122 of the power semiconductor die 114. According to the embodiment of FIG. 2, one end 128, 130 of each interconnect 124, 126 is attached to the corresponding top side terminal 120, 122 of the power semiconductor die 114 and the other end 132, 134 of each interconnect 124, 126 is attached to a separate section 116b, 116c of the uppermost metallization layer 116 of the power board. The section 116b of the uppermost metallization layer 116 of the power board attached to the gate interconnect 124 is a dummy section in that this section is not electrically contacted outside of the power semiconductor module, because the flexible board 104 provides the gate signal to the power semiconductor die 114. In general, any standard joining technology such as ultrasonic bonding, sintering, diffusion soldering, brazing, laser welding, EBW, etc. can be used to the join one end 128, 130 of the interconnects 124, 126 to the respective top side terminals 124, 126 of the power semiconductor die 114 and the other end 132, 134 of the interconnects 124, 126 to the respective sections 116b, 116c of the uppermost metallization layer 116 of the power board.

In one embodiment, the interconnects 124, 126 are copper wires having a thickness of at least 150 µm, copper ribbons having a thickness of at least 100 µm or copper clips having a thickness of at least 300 µm. The wires, ribbons or clips 124, 126 may be plated by another metal or coated by e.g. thin polymers. Alternatively, aluminum wires or aluminum ribbons can be used as the interconnects 124, 126. The flexible board 104 is attached to the interconnects 124, 126 after the interconnects 124, 126 are joined to the top side terminals 120, 122 of the power semiconductor die 114. In one embodiment, the flexible board 104 is a flex PCB or flexible circuit board.

The lower metal layer 108 of the flexible board 104 is attached to a first one 124 of the interconnects (e.g. the gate interconnect) e.g. by a solder or laser weld 136, and the upper metal layer 106 of the flexible board 104 is attached to a second one 126 of the interconnects (e.g. the source or emitter interconnect) e.g. by a conductive via, solder or laser weld 138 that extends through the insulator 110 of the flexible board 104. For example in the case of a power MOSFET or IGBT die, the first top side terminal 120 of the die 114 is a control or gate terminal and the second top side terminal 122 of the die 114 is a power emitter or source terminal. The second top side terminal 122 is a 'power' terminal in that the terminal is in the main current flow path of the power die 114. The lower metal layer 108 of the flexible board 104 is attached to a section of the first (gate) interconnect 124 between the first and second ends 128, 132 of the first interconnect 124, and the upper metal layer 106 of the flexible board 104 is similarly attached to a section of the second (source/emitter) interconnect 126 between the first and second ends 130, 134 of the second interconnect 126.

The upper metal layer 106 of the flexible board 104 is configured to carry a ground signal from an external gate driver circuit to the interconnect 126 attached to the source/emitter terminal 122 of the power semiconductor die 114. The lower metal layer 108 of the flexible board 104 is configured to carry a gate drive signal from the external gate driver circuit to the interconnect 124 attached to the control or gate terminal 120 of the power semiconductor die 114. With such a configuration, the flexible board 104 is spaced apart from the power semiconductor die 114 by the interconnects 124, 126 attached to the top side terminals 120, 122 of the power semiconductor die 114. The lower metal layer 108 is removed in the region of connection between the upper metal layer 106 to the corresponding interconnect 126 so as to not interfere with this electrical connection. The metallization layer 106 may also be pre-moved around the joint 136 to allow the joint 136 to have a via as well, or e.g. being laser welded from the top side. The metal layers 106, 108 of the flexible board 104 can be attached to the corresponding interconnects 124, 126 using any standard joining technology such as ultrasonic bonding, sintering, diffusion soldering, brazing, laser welding, EBW, etc.

Figure 3:
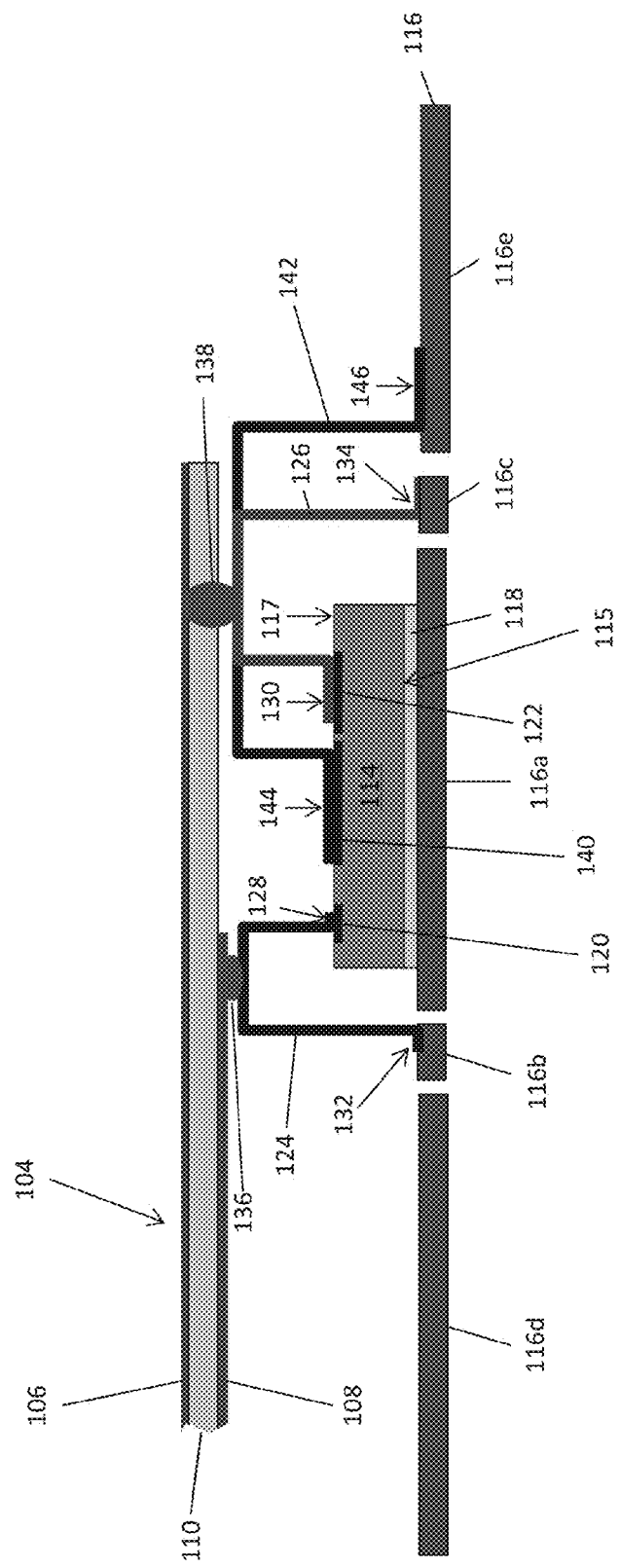

FIG. 3 illustrates a sectional view of the power semiconductor module with the housing 100 removed, according to another embodiment. The embodiment shown in FIG. 3 is similar to the embodiment shown in FIG. 2, however, the second terminal 122 of the power semiconductor die 114 is an auxiliary emitter/source terminal instead of the main power emitter/source terminal 140. The auxiliary emitter/source terminal 122 is unpowered and coupled to the main emitter/source of the power transistor. As such, only driver current and not the main power current flows to the auxiliary emitter/source terminal 122 via the corresponding interconnect 126 of the power semiconductor module. A separate top side terminal 140 can be provided for the main (powered) emitter/source connection of the power transistor die 114. The main power emitter/source terminal 140 can be shorted with the auxiliary emitter/source terminal 122. A large metallization layer on top of the power transistor die 114 forms the emitter/source of the power semiconductor 114. By placing a terminal 126 without shorting sections 116c and 116e of the uppermost metallization layer 116, the terminal 126 becomes an auxiliary emitter. Terminal 126 picks the voltage directly at the semiconductor top side and any voltage drop along additional interconnect 142 by parasitic inductance or resistance is bypassed.

The additional interconnect 142 has a first end 144 attached to the main source/emitter terminal 140 of the semiconductor die 114, and a second end 146 attached to one of the sections 116e of the uppermost metallization layer 116 of the power board. This section 116e of the metallization layer 116 is in the main current flow path of the power device. Neither metal layer 106, 108 of the flexible board 104 is attached to the powered emitter/source interconnect 142 of the module according to this embodiment. The section 116c of the uppermost metallization layer 116 of the board attached to the second end 134 of the auxiliary emitter/source interconnect 126 is a dummy section in that it is not electrically contacted outside of the power semiconductor module and is not part of the main current flow path of the power device.

Figure 4:
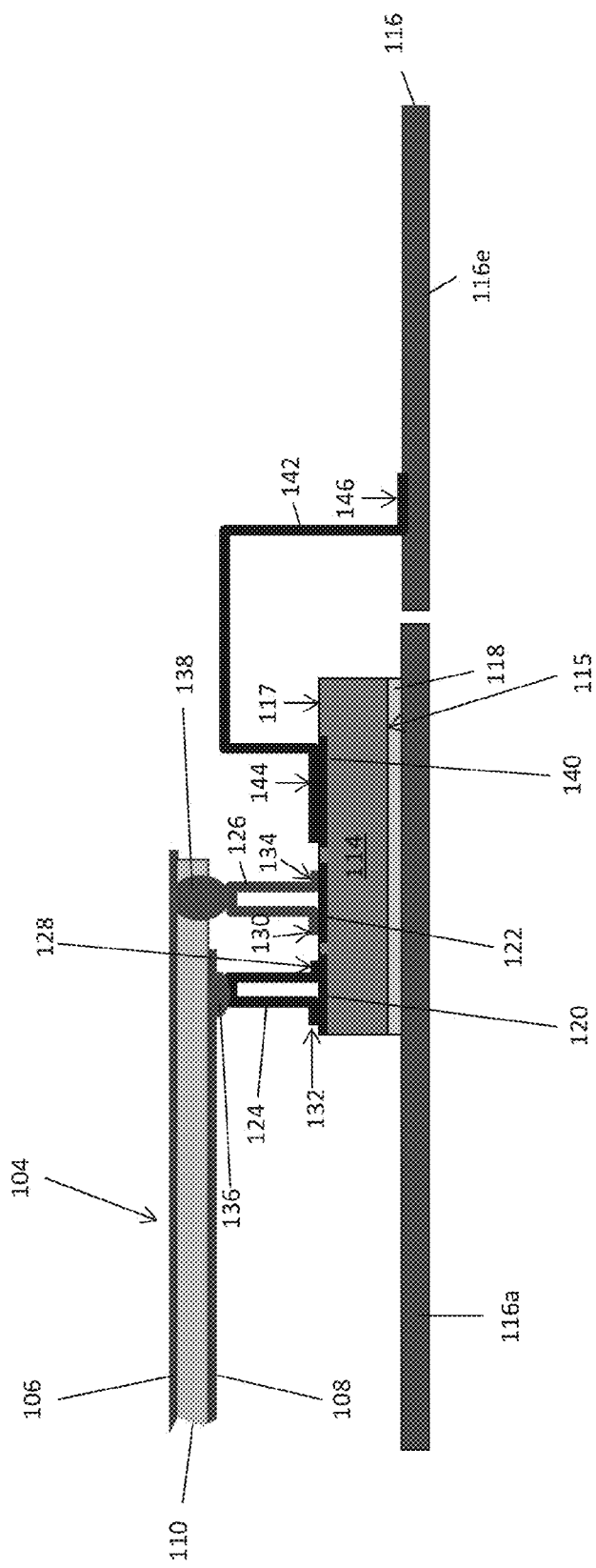

FIG. 4 illustrates a sectional view of the power semiconductor module with the housing 100 removed, according to yet another embodiment. The embodiment shown in FIG. 4 is similar to the embodiment shown in FIG. 3, however, the gate interconnect 124 has a first end 128 attached to a first section of the control or gate terminal 120 of the semiconductor die 114 and a second end 132 attached to a second section of the control or gate terminal 120. The lower metal layer 108 of the flexible board 104 is attached to a section of the gate interconnect 124 between the first and second ends 128, 132 of the gate interconnect 124. The auxiliary emitter/source interconnect 126 similarly has a first end 130 attached to a first section of the auxiliary emitter/source terminal 122 of the semiconductor die 114 and a second end 134 attached to a second section of the auxiliary emitter/source terminal 122. The upper metal layer 106 of the flexible board 104 is attached to a section of the auxiliary emitter/source interconnect 126 between the first and the second ends 130, 134 of the auxiliary emitter/source interconnect 126. This configuration eliminates the need for corresponding dummy gate and emitter/source sections patterned into the uppermost metallization layer 116 of the power board. The gate interconnect 124 shown in FIG. 2 can have a similar configuration i.e. both ends 128, 132 attached to the control or gate terminal 120 of the power semiconductor die 114. Again, the main power emitter/source terminal 140 and the auxiliary emitter/source terminal 122 can be shorted.

Figure 5:
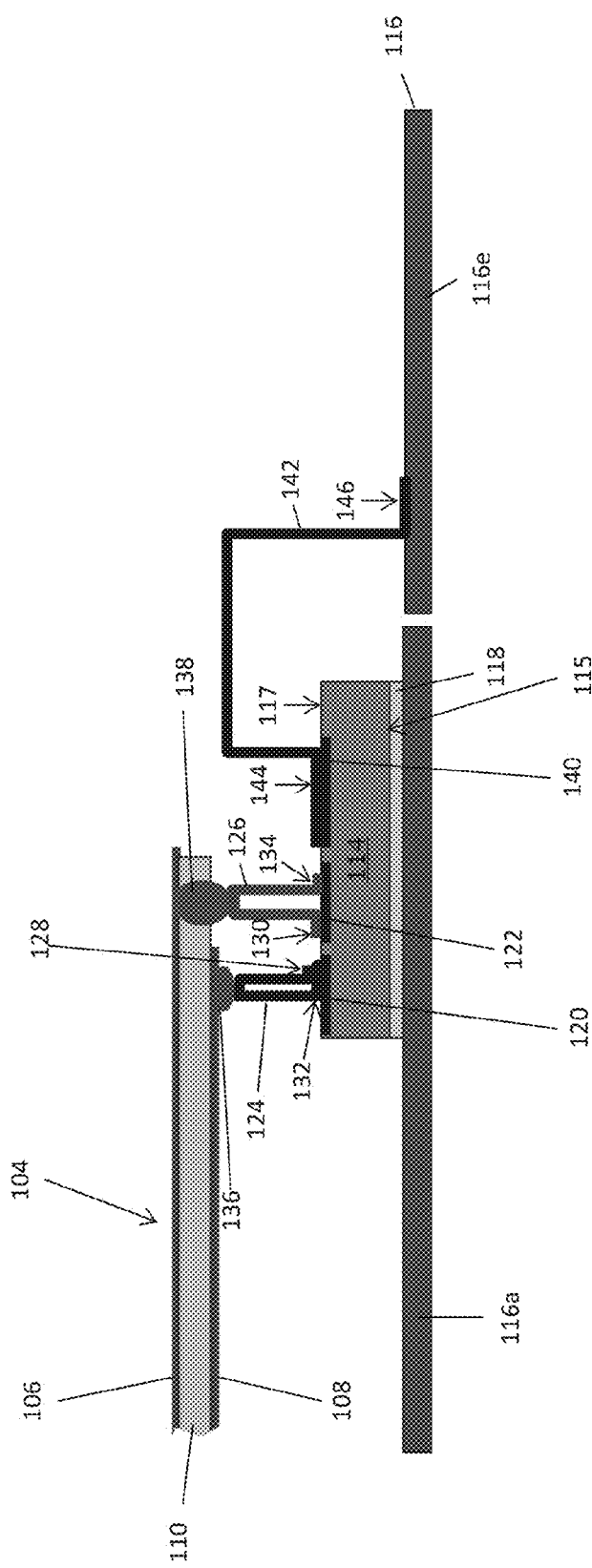

FIG. 5 illustrates a sectional view of the power semiconductor module with the housing 100 removed, according to still another embodiment. The embodiment shown in FIG. 5 is similar to the embodiment shown in FIG. 4, however, the gate interconnect 124 has one end 132 attached to the control or gate terminal 120 of the power semiconductor die 114 and the other end 128 disposed on and attached to the first end 132. This way, the size of the die control or gate terminal 120 need not be enlarged to accommodate both ends 128, 132 of the gate interconnect 124.

The lower metal layer 108 of the flexible board 104 is attached to a section of the gate interconnect 124 between the stacked first and second ends 128, 132 of the gate interconnect 124. In addition or alternatively, the auxiliary emitter/source interconnect 126 can have the same stacked end configuration as the gate interconnect 124. The upper metal layer 106 of the flexible board 104 is attached to a section of the auxiliary emitter/source interconnect 126 between the stacked ends 130, 134 of the auxiliary emitter/source interconnect 126.

Figure 6:
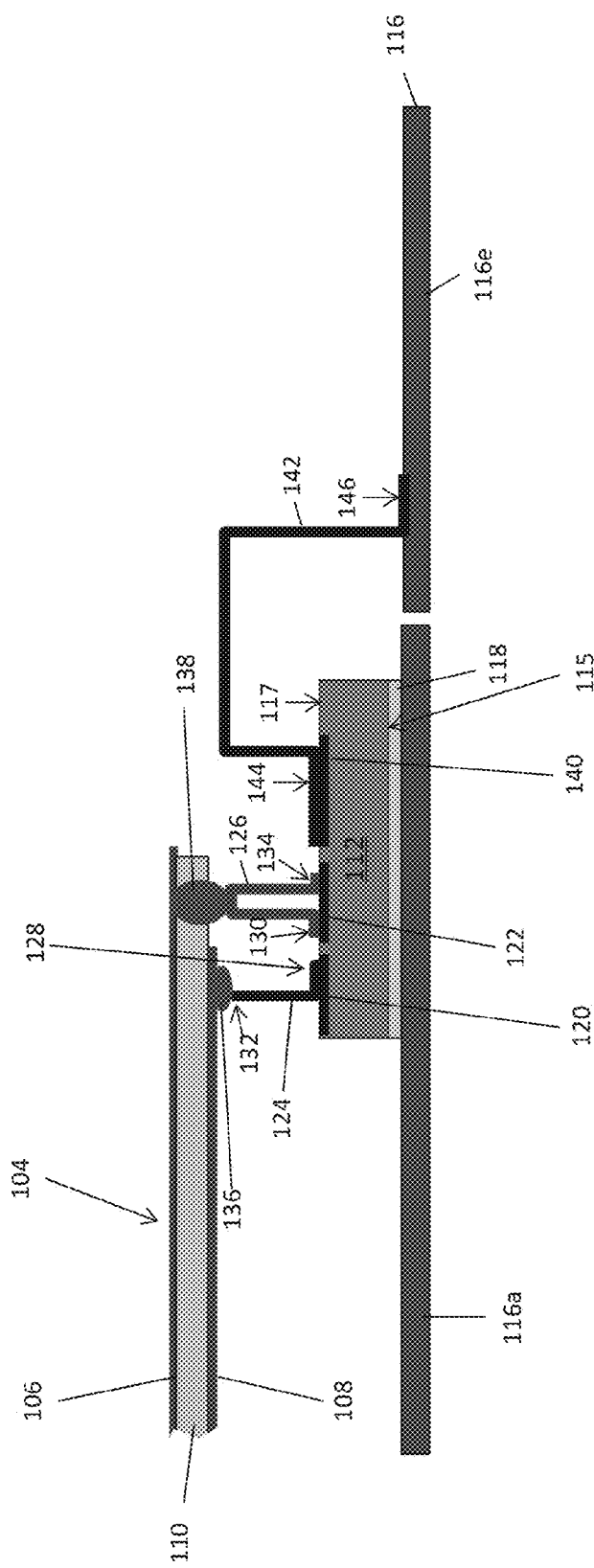

FIG. 6 illustrates a sectional view of the power semiconductor module with the housing 100 removed, according to another embodiment. The embodiment shown in FIG. 6 is similar to the embodiments shown in FIGS. 4 and 5, however, the gate interconnect 124 has a first end 128 attached to the control or gate terminal 120 of the power semiconductor die 114 and a second (unbent) end attached to the lower metal layer 108 of the flexible board 104 by a so called stud bond 136. In the case of bond wire interconnects, the second (unbent) end 132 can be formed by cutting or pulling the corresponding bond wire 124. In addition or alternatively, the auxiliary emitter/source interconnect 126 can have the same unbent end connection configuration with the upper metal layer 106 of the flexible board through a conductive via, solder or laser weld 138 that extends through the insulator 110 of the flexible board 104.

Figure 7:
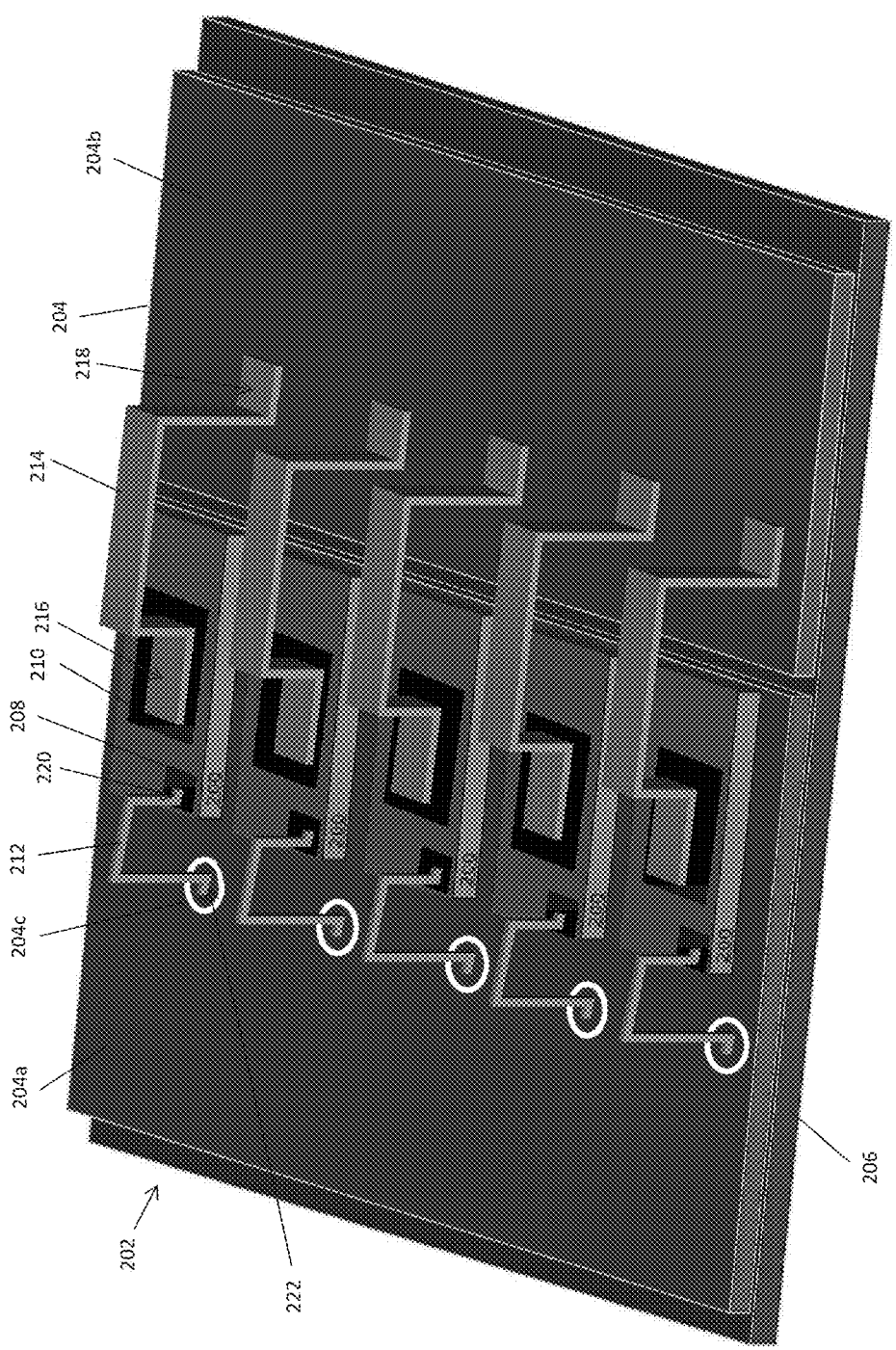
FIGS. 7 and 8 illustrate an embodiment of a method of manufacturing a power semiconductor module having a flexible board which provides external driver connections to each semiconductor dies housed within the power semiconductor module.
Figure 8:
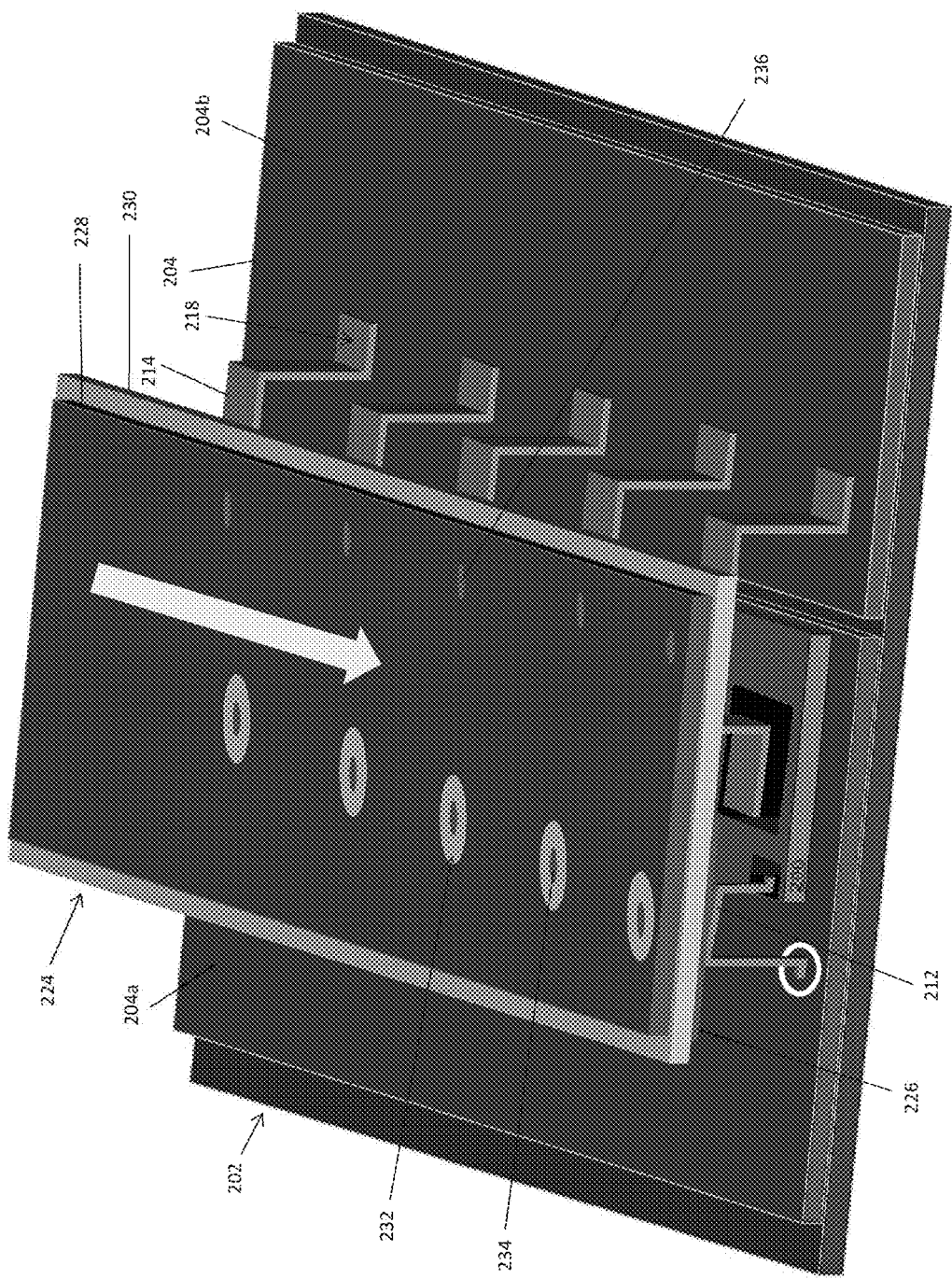

FIGS. 7 and 8 illustrate an embodiment of a method of manufacturing a power semiconductor module having a flexible board which provides external driver connections to semiconductor dies housed within the power semiconductor module.

In FIG. 7, a plurality of power semiconductor dies 200 are attached to a power board 202 such as a DCB, AMB or DAB substrate, a PCB, or a lead frame. The power board 202 can include one or more metallization layers 204 disposed on or in an insulating substrate 206. The power semiconductor dies 200 are attached to the uppermost metallization layer 204 of the power board 202. The uppermost metallization layer 204 is patterned into a plurality of sections 204a, 204b, 204c separated from one another. The lower side (out of view) of each power semiconductor die 200 is attached to a first one 204a of the sections of the patterned metallization layer 204. In the case of a vertical device in which the current flow direction is between the top and bottom sides of the die 200, the lower side of the die 200 can be a power terminal such as the drain of a power MOSFET, collector of an IGBT or anode of a power diode. The power terminal is attached e.g. by diffusion soldering, sintered, soldered, glued, etc. to the first section 204a of the patterned metallization layer 204 of the power board 202. In the case of a lateral device in which the current flow direction is horizontal, the lower side of the die 200 is not active.

In either case, at least some of the power semiconductor dies 200 are power transistor dies each having a first terminal 208 and a second terminal 210 disposed at the side of the die 200 facing away from the patterned metallization layer 204 of the power board 202. For example in the case of a power MOSFET, each power MOSFET die 200 can have a gate terminal 208 and a source terminal 210 at the side of the die 200 facing away from the patterned metallization layer 204. In the case of an IGBT, each IGBT die 200 can have a gate terminal 208 and an emitter terminal 210 at the side of the die 200 facing away from the patterned metallization layer 204. In the case of a power diode, each diode die 200 can have a cathode terminal 210 at the side of the die facing away from the patterned metallization layer 204 and the gate terminal 208 is omitted.

For the power transistor dies 200, first interconnects 212 such as bond wires, bond ribbons or metal clips are attached to the first (e.g. gate) terminal 208 of the power transistor dies 200 and second interconnects 214 such as bond wires, bond ribbons or metal clips are attached to the second (e.g. emitter or source) terminal 210 of the power transistor dies 200. In the case of power diode dies 200, only the second interconnects 214 are necessary for contacting the anode or cathode terminal 210 of the diode dies 200.

The second interconnects 214 which are power interconnects typically placed in parallel to form the power terminal and are attached at a first end 216 to the second terminal 210 of the power semiconductor dies 200. The second end 218 of each second interconnect 214 is attached to a second one 204b of the sections of the patterned metallization layer 204. The first interconnects 212 are attached at a first end 220 to the first terminal 208 of the power semiconductor dies 200 and at a second end 222 to a third one 204c of the sections of the patterned metallization layer 204. The second interconnects 214 extend in parallel with one another from the second section 204b of the patterned metallization layer 204 to the second terminal 210 of the respective semiconductor dies 200.

In FIG. 8, a flexible board 224 is provided. The flexible board 224 can protrude out of the module housing (not shown) and make contact to a driver circuit (also not shown) external to the module housing to realize a parallel plate wave guide design from the driver circuit to the power semiconductor dies 200 inside the module housing. The driver circuit/electronics can be integrated on the flexible board 224 as previously described herein, so that the flexible board 224 serves as a bus to the top side interconnects 212, 214, carrier of the driver circuit and interface to the controller or any external communication means. Alternatively or in addition, one or more of the driver circuit dies can be disposed in another housing or attached to another board separate from the power semiconductor module.

In each case, the flexible board 224 comprises a first (lower) metal layer 226, a second (upper) metal layer 228 and an insulator 230 between the lower and upper metal layers 226, 228 so that the lower and upper metal layers 226, 228 are electrically insulated from one another. The lower metal layer 226 is attached to the first (e.g. gate) interconnects 212 and the upper metal layer 228 is attached to the second (e.g. emitter/source) interconnects 214 such that the flexible board 224 is spaced apart from the power semiconductor dies 200 by the interconnects 212, 214. In the case of laser welding as the joining technology, the upper metal layer 228 has openings 232 which expose the underlying insulator 230. A laser beam is directed downward at the flexible board 224 and into the openings 232 formed in the upper metal layer 228. The laser beam provides a concentrated heat source which may melt the insulator 230 and melts the lower metal layer 226 in localized areas, allowing for narrow welds 234 with the first interconnects 212. Alternatively, electron beam welding (EBW) can be used in which a beam of high-velocity electrons is applied to the materials to be joined. With EBW, the work pieces melt and flow together as the kinetic energy of the electrons is transformed into heat upon impact. The upper metal layer 228 can be similarly joined to the second interconnects 214 e.g. by laser or electron beam welding. The lower metal layer 226 is removed in the general area of the weld regions between the upper metal layer 228 and the second interconnects 214 to prevent shorting between the lower and upper metal layers 226, 228 of the flexible board 224. In the case of laser welding, a focused laser beam melts the upper metal layer 228 and underlying insulator 230 in localized areas to provide narrow welds 236 with the second interconnects 214. Other joining methods such as sintering, diffusion soldering or brazing can be used to form localized connections between the metal layers 226, 228 of the flexible board 224 and the corresponding interconnects 212, 214 of the power semiconductor module. In FIG. 8, the current flow direction in the flexible board 224 is perpendicular to the parallel arrangement of the second interconnects 214 as indicated by the solid arrow shown in FIG. 8. A housing can be added to enclose the interconnects 212, 214 and power semiconductor dies 200 e.g. as shown in FIG. 1.

Figure 9:
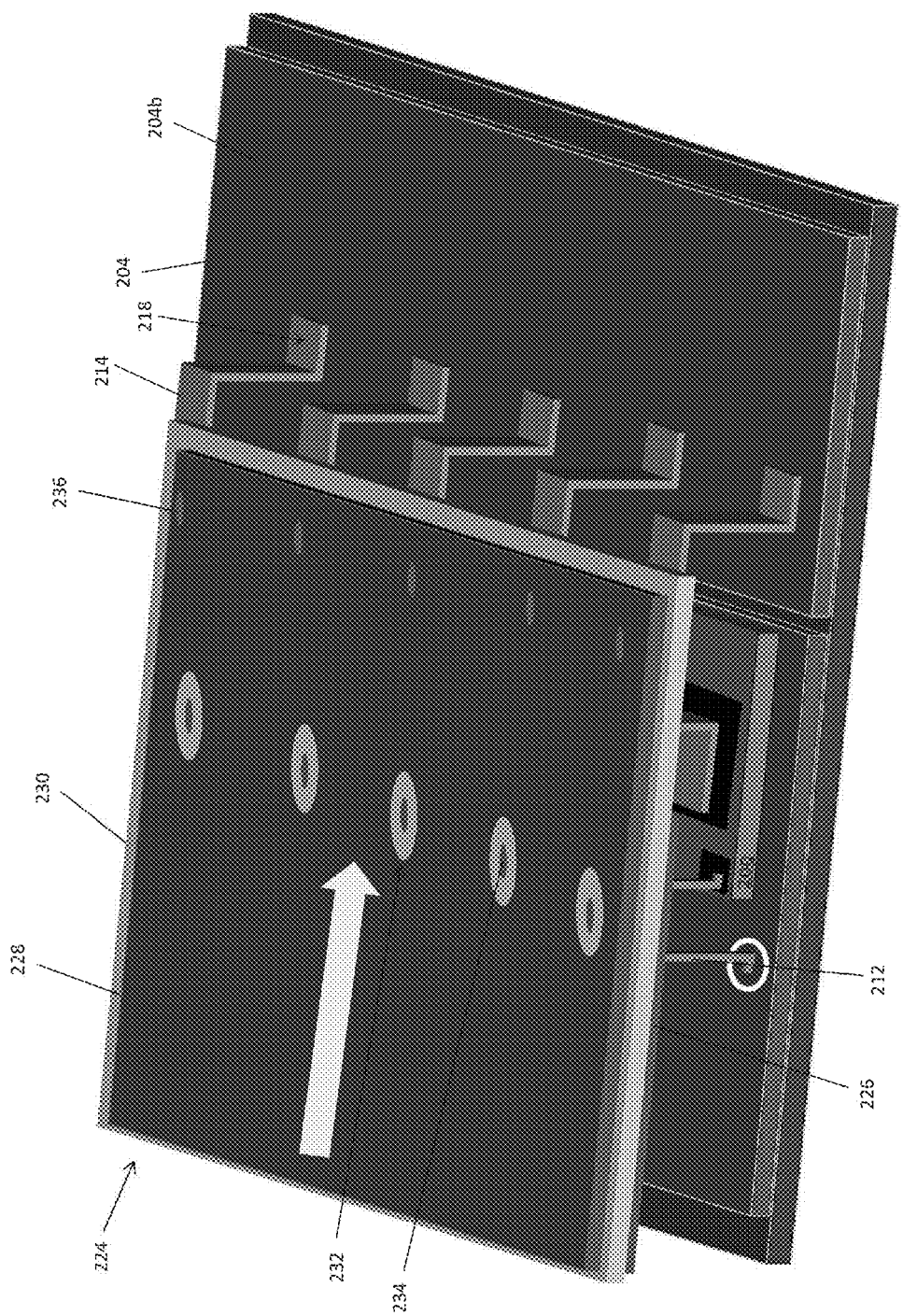
FIG. 9 illustrates a perspective view of another embodiment of a power semiconductor module having a flexible board which provides external driver connections to semiconductor dies housed within the power semiconductor module.

FIG. 9 illustrates another embodiment of a power semiconductor module after the flexible board 224 is attached to the underlying interconnects 212, 214 of the module. The embodiment shown in FIG. 9 is similar to the embodiment shown in FIG. 8, however, the current flow direction in the flexible board 224 is parallel with the parallel arrangement of the second interconnects 214 as indicated by the solid arrow shown in FIG. 9.

Figure 10:
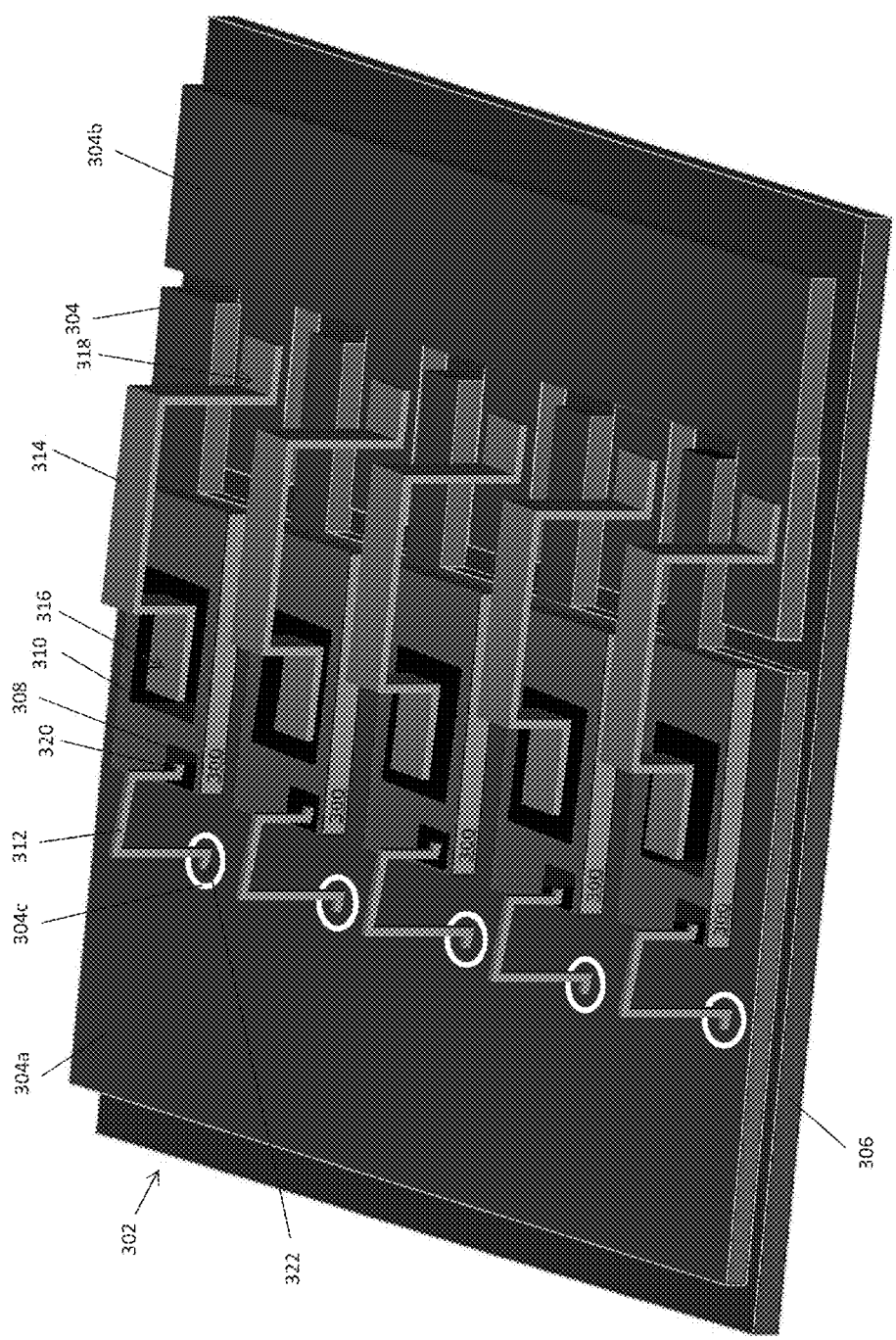
FIGS. 10 and 11 illustrate another embodiment of a method of manufacturing a power semiconductor module having a flexible board which provides external driver connections to semiconductor dies housed within the power semiconductor module.
Figure 11:
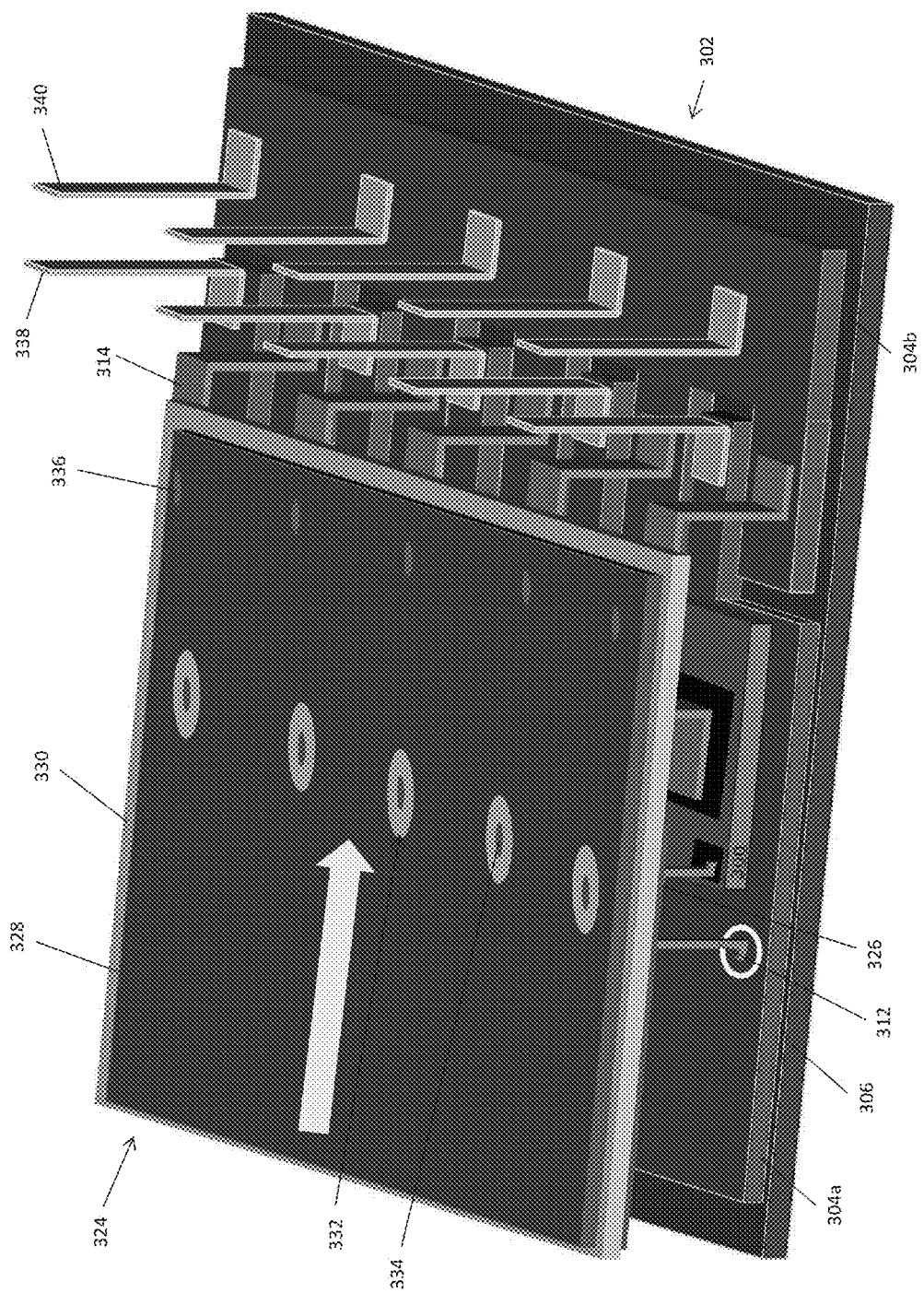

FIGS. 10 and 11 illustrate another embodiment of a method of manufacturing a power semiconductor module having a flexible board which provides external driver connections to semiconductor dies housed within the power semiconductor module.

In FIG. 10, a plurality of power semiconductor dies 300 are attached to a power board 302 such as a DCB, AMB or DAB substrate, a PCB, or a lead frame. The power board 302 can include one or more metallization layers 304 disposed on or in an insulating substrate 306. The power semiconductor dies 300 are attached to the uppermost metallization layer 304 of the power board 302. The uppermost metallization layer 304 is patterned into a plurality of sections 304a, 304b, 304c which are separated from one another. The lower side (out of view) of each power semiconductor die 300 is attached to a first one 304a of the sections of the patterned metallization layer 304. In the case of a vertical device in which the current flow direction is between the top and bottom sides of the die 300, the lower side of the die 300 can be a power terminal such as the drain of a power MOSFET, collector of an IGBT or anode or cathode of a power diode. The power terminal is attached e.g. by diffusion soldering to the first section 304a of the patterned metallization layer 304 of the power board 302. In the case of a lateral device in which the current flow direction is horizontal, the lower side of the die 300 is not active and merely dissipates heat. In this case, the lower side of the die 300 can be soldered or glued to the first section 304a of the patterned metallization layer 304.

In either case, at least some of the power semiconductor dies 300 are power transistor dies each having a first terminal 308 and a second terminal 310 disposed at the side of the die 300 facing away from the patterned metallization layer 304 of the power board 302. For example in the case of a power MOSFET, each power MOSFET die 300 can have a gate terminal 308 and a source terminal 310 at the side of the die 300 facing away from the power board 302. In the case of an IGBT, each IGBT die 300 can have a gate terminal 308 and an emitter terminal 310 at the side of the die 300 facing away from the power board 320. In the case of a power diode 300, each diode die 300 can have a cathode terminal 310 at the side of the die 300 facing away from the power board 302 and the gate terminal 308 is omitted.

For the power transistor dies 300, first interconnects 312 such as bond wires, bond ribbons or metal clips are attached to the first (e.g. gate) terminal 308 of the power transistor dies 300 and second interconnects 314 such as bond wires, bond ribbons or metal clips are attached to the second (e.g. emitter or source) terminal 310 of the power transistor dies 300. In the case of power diode dies 300, only the second interconnects 314 are necessary for contacting the anode or cathode terminal of the diodes.

The second interconnects 314 are attached at a first end 316 to the second terminal 310 of the power semiconductor dies 300. The opposite end 318 of each second interconnect 314 is attached to a second one 304b of the sections of the patterned metallization layer 304 of the power board 302. The first and second sections 304a, 304b of the patterned metallization layer 304 have interleaved finger-like structures. The first interconnects 312 are attached at a first end 320 to the first terminal 308 of the power semiconductor dies 300 and at a second end 322 to a third one 304c of the sections of the patterned metallization layer 304 of the power board 302. The second interconnects 314 extend in parallel with one another from the second section 304b of the patterned metallization layer 304 to the second terminal 310 of the respective semiconductor dies 300.

In FIG. 11, a flexible board 324 is provided. The flexible board 324 can protrude out of the module housing (not shown) and make contact to a driver circuit external to the module housing to realize a parallel plate wave guide design from the driver circuit to the power semiconductor dies 300 inside the module. The driver circuit/electronics can be integrated on the flexible board 324 as previously described herein, so that the flexible board 324 serves as a bus for the module interconnects 312, 314, carrier of the driver circuit and interface to the controller or any external communication means. Alternatively or in addition, one or more of the driver circuit dies can be disposed in another housing or attached to another board separate from the power semiconductor module.

In each case, the flexible board 324 comprises a first (lower) metal layer 326, a second (upper) metal layer 328 and an insulator 330 between the lower and upper metal layers 326, 328 so that the lower and upper metal layers 326, 328 are electrically insulated from one another. The lower metal layer 326 is attached to the first (e.g. gate) interconnects 312 and the upper metal layer 328 is attached to the second (e.g. emitter/source) interconnects 314 such that the flexible board 324 is spaced apart from the power semiconductor dies 300 by the interconnects 312, 314. In the case of laser welding as the joining technology, the upper metal layer 328 has openings 332 which expose the underlying insulator 330. A laser beam is directed downward at the flexible board 324 and into the openings 332 formed in the upper metal layer 328. The laser beam provides a concentrated heat source which melts the insulator 330 and the lower metal layer 326 in localized areas, allowing for narrow welds 334 with the first interconnects 312. The upper metal layer 328 is similarly joined e.g. by laser or electron beam welding in localized areas to the second interconnects 314 via welds 336. The lower metal layer 326 is removed in the general area of the weld regions between the upper metal layer 328 and the second interconnects 314 to prevent shorting between the lower and upper metal layers 326, 328 of the flexible board 324. In the case of laser welding, a focused laser beam melts the upper metal layer 328 and the underlying insulator 330 in localized areas to provide narrow welds 336 with the second interconnects 314. Other joining methods such as sintering, diffusion soldering, brazing or EBW can be used to locally form localized connections between the metal layers 326, 328 of the flexible board 324 and the interconnects 312, 314 of the power semiconductor module. In FIG. 11, the current flow direction in the flexible board 324 is parallel to the parallel arrangement of the second interconnects 314 as indicated by the solid arrow shown in FIG. 11. Alternatively, the flexible board 324 can be arranged so that the current flow direction in the flexible board 324 is perpendicular to the parallel arrangement of the second interconnects 314 e.g. as shown in FIG. 8. In either case, a housing can then be added as part of the power semiconductor module e.g. as shown in FIG. 1.

The power semiconductor module further includes a first plurality of power terminals 338 extending vertically from the first section 304a of the patterned metallization layer 304 of the power board 302 and a second plurality of power terminals 340 extending vertically from the second section 304b of the patterned metallization layer 304 and in parallel with the first plurality of power terminals 338. The power terminals 338, 340 provide the main powered connections to the semiconductor dies 300 within the module. In one embodiment, the flexible board 324 extends perpendicular to the power terminals 338, 340 and terminates prior to reaching the power terminals 338, 340. With such a configuration, a low inductive symmetric power circuit and low inductive symmetric gate circuit are realized. For example in the case of IGBT dies 300, the collector metal 304a on the power board 302 extends into the emitter metal 304b of the power board metallization 304 in a comb-like arrangement. Several terminals or terminal feet (bases) 338, 340 are placed there, in parallel. The row of emitter and collector terminals or terminal feet is adjacent to each other and in close proximity to achieve a low parasitic inductance within the collector-emitter power circuit. A housing can be added as part of the power semiconductor module e.g. as shown in FIG. 1.

Figure 12:
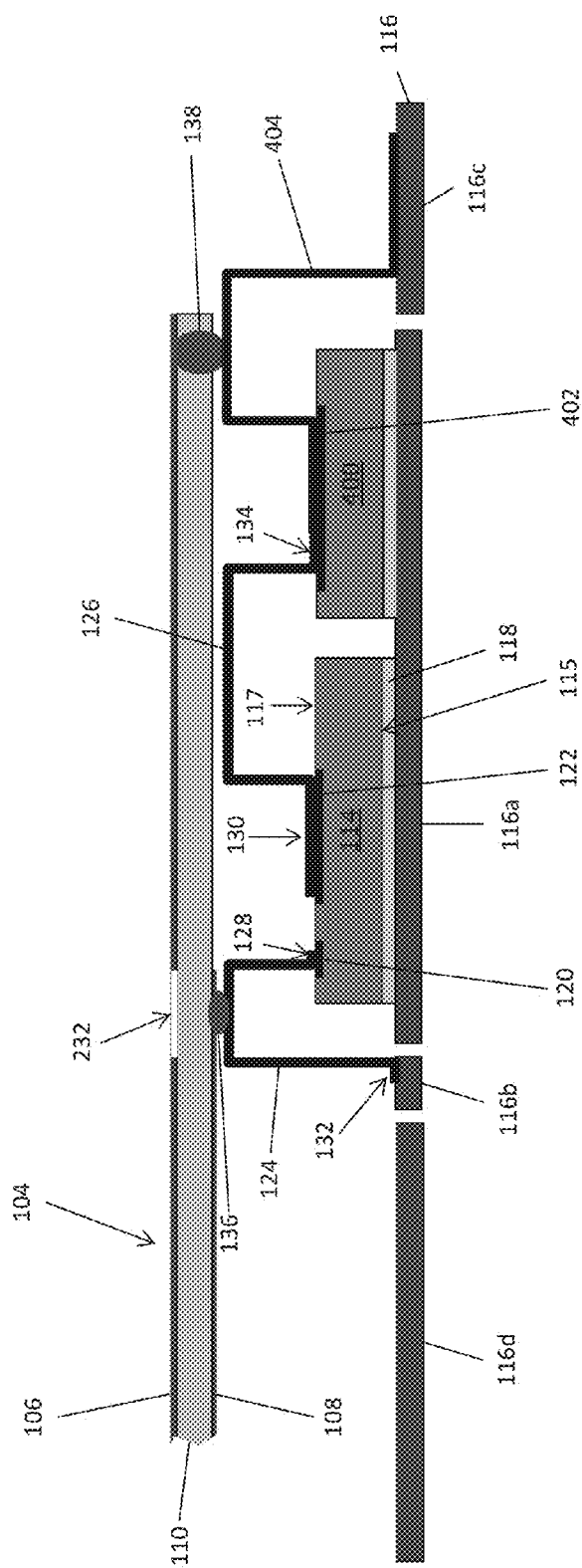
FIG. 12 illustrates a sectional view of a low gate drive inductance flexible board connection for power semiconductor modules according to yet another embodiment.

FIG. 12 illustrates a sectional view of the power semiconductor module with the housing 100 removed, according to another embodiment. The embodiment shown in FIG. 12 is similar to the embodiment shown in FIG. 2, however, a freewheeling diode 400 is connected anti-parallel to the power semiconductor die 114 which is an IGBT in this embodiment. The anode terminal 402 of the freewheeling diode 400 is at the top side of the diode 400. The anode terminal 402 is bonded to the top side emitter terminal 122 of the IGBT 114 via the second interconnect 126. An additional interconnect 404 such as a bond wire, bond ribbon or metal clip is attached at one end to the second interconnect 126 through e.g. a stitch bond and at the opposite end to section 116c of the uppermost metallization layer 116 of the power board. The additional interconnect 404 is connected to the upper metal layer 106 of the flexible board 104 between its opposing ends by a conductive via, solder or laser weld 138 that extends through the insulator 110 of the flexible board 104. The cathode terminal at the bottom side of the freewheeling diode 400 is connected to the same section 116a of the uppermost metallization layer 116 of the power board as the collector (bottom side) terminal of the IGBT 114 to complete the anti-parallel connection.

In any of the embodiments previously described herein, the top and bottom metal layers 106, 108 of the flexible board can be interchanged with respect to the gate and emitter/source connections. In some cases the top metal layer 106 has openings (232, 332) as shown in FIGS. 9 through 11 and vias can be provided to support joining to the bottom metal layer 108. Vias can also be provided for support joining to the top metal layer 106. Typically, the power module includes two or more legs of power semiconductors or power semiconductor arrays (parallel power semiconductors) which are isolated from another. The space between the flexible board 104 and the uppermost metallization layer 116 of the power board to which the die(s) 114 are attached is typically 2 mm to 8 mm, at least 1 mm, maximum 50 mm. The term 'ground' as used herein with reference from the driver is not actual (earth) ground of the entire power circuit.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:
a metallization layer;
a power semiconductor die attached to the metallization layer and having a first terminal and a second terminal disposed at a side of the die facing away from the metallization layer;
a first interconnect attached to the first terminal;
a second interconnect attached to the second terminal; and
a flexible board comprising a first metal layer, a second metal layer and an insulator between the first and the second metal layers so that the first and the second metal layers are electrically insulated from one another,
wherein the first metal layer is attached to the first interconnect and the second metal layer is attached to the second interconnect such that the flexible board is spaced apart from the power semiconductor die by the first and the second interconnects.

2. The power semiconductor module of claim 1, wherein the first and the second interconnects are bond wires, bond ribbons or metal clips.

3. The power semiconductor module of claim 1, wherein the first metal layer is welded to the first interconnect and the second metal layer is welded to the second interconnect.

4. The power semiconductor module of claim 1, wherein:
the first metal layer of the flexible board is configured to carry a ground signal from an external driver;
the second metal layer of the flexible board is configured to carry a drive signal from the external driver;
the first terminal of the power semiconductor die is an emitter or source terminal; and
the second terminal of the power semiconductor die is a control or gate terminal.

5. The power semiconductor module of claim 4, wherein one or more semiconductor dies and/or passive components of the external driver are attached to a section of the flexible board which protrudes out of a housing of the power semiconductor module.

6. The power semiconductor module of claim 1, wherein:
the metallization layer has a plurality of sections separated from one another; and
the power semiconductor die is attached to a first one of the sections of the metallization layer at a side of the die facing the metallization layer.

7. The power semiconductor module of claim 6, wherein:
the first interconnect has a first end attached to the first terminal of the semiconductor die and a second end attached to a second one of the sections of the metallization layer;
the second interconnect has a first end attached to the second terminal of the semiconductor die and a second end attached to a third one of the sections of the metallization layer;
the first metal layer of the flexible board is attached to a section of the first interconnect between the first and the second ends of the first interconnect; and
the second metal layer of the flexible board is attached to a section of the second interconnect between the first and the second ends of the second interconnect.

8. The power semiconductor module of claim 7, wherein:
the second terminal of the power semiconductor die is an auxiliary emitter or source terminal;
the power semiconductor module further comprises a third interconnect having a first end attached to a main source or emitter terminal of the semiconductor die at the same side of the die as the auxiliary emitter or source terminal, and a second end attached to a fourth one of the sections of the metallization layer; and
the first and the second metal layers of the flexible board are not connected to the third interconnect.

9. The power semiconductor module of claim 1, wherein:
the first interconnect has a first end attached to a first section of the first terminal of the semiconductor die and a second end attached to a second section of the first terminal; and
the first metal layer of the flexible board is attached to a section of the first interconnect between the first and the second ends of the first interconnect.

10. The power semiconductor module of claim 9, wherein:
the second interconnect has a first end attached to a first section of the second terminal of the semiconductor die and a second end attached to a second section of the second terminal; and the second metal layer of the flexible board is attached to a section of the second interconnect between the first and the second ends of the second interconnect.

11. The power semiconductor module of claim 9, wherein:
the second terminal of the power semiconductor die is an auxiliary emitter or source terminal;
the power semiconductor module further comprises a third interconnect having a first end attached to a main source or emitter terminal of the semiconductor die at the same side of the die as the auxiliary emitter or source terminal, and a second end attached to the metallization layer; and
the first and the second metal layers of the flexible board are not connected to the third interconnect.

12. The power semiconductor module of claim 1, wherein:
the first interconnect has a first end attached to the first terminal of the semiconductor die and a second end disposed on and attached to the first end; and
the first metal layer of the flexible board is attached to a section of the first interconnect between the first and the second ends of the first interconnect.

13. The power semiconductor module of claim 12, wherein:
the second interconnect has a first end attached to the second terminal of the semiconductor die and a second end disposed on and attached to the first end; and
the second metal layer of the flexible board is attached to a section of the second interconnect between the first and the second ends of the second interconnect.

14. The power semiconductor module of claim 12, wherein:
the second terminal of the power semiconductor die is an auxiliary emitter or source terminal;
the power semiconductor module further comprises a third interconnect having a first end attached to a main source or emitter terminal of the semiconductor die at the same side of the die as the auxiliary emitter or source terminal, and a second end attached to the metallization layer; and
the first and the second metal layers of the flexible board are not connected to the third interconnect.

15. The power semiconductor module of claim 1, wherein the first interconnect has a first end attached to the first terminal of the semiconductor die and a second end attached to the first metal layer of the flexible board.

16. The power semiconductor module of claim 15, wherein the second interconnect has a first end attached to the second terminal of the semiconductor die and a second end attached to the second metal layer of the flexible board.

17. The power semiconductor module of claim 15, wherein:
the second terminal of the power semiconductor die is an auxiliary emitter or source terminal;
the power semiconductor module further comprises a third interconnect having a first end attached to a main source or emitter terminal of the semiconductor die at the same side of the die as the auxiliary emitter or source terminal, and a second end attached to the metallization layer; and
the first and the second metal layers of the flexible board are not connected to the third interconnect.

18. A power semiconductor module, comprising:
a patterned metallization layer having a plurality of sections separated from one another;
a plurality of power semiconductor dies attached at least to a first one of the sections of the patterned metallization layer and each having a first terminal and a second terminal disposed at a side of the die facing away from the patterned metallization layer;
first interconnects attached to the first terminal of the power semiconductor dies;
second interconnects attached to the second terminal of the power semiconductor dies; and
a flexible board comprising a first metal layer, a second metal layer and an insulator between the first and the second metal layers so that the first and the second metal layers are electrically insulated from one another,
wherein the first metal layer is attached to the first interconnects and the second metal layer is attached to the second interconnects such that the flexible board is spaced apart from the power semiconductor dies by the first and the second interconnects.

19. The power semiconductor module of claim 18, wherein:
the second interconnects extend in parallel from a second one of the sections of the patterned metallization layer to the second terminal of the respective semiconductor dies; and
a current flow direction in the flexible board is parallel to the second interconnects.

20. The power semiconductor module of claim 18, wherein:
the second interconnects are attached at a first end to the second terminal of the power semiconductor dies and at a second end to a second one of the sections of the patterned metallization layer;
the power semiconductor module comprises a first plurality of power terminals extending vertically from the first section of the patterned metallization layer and a second plurality of power terminals extending vertically from the second section of the patterned metallization layer and in parallel with the first plurality of power terminals; and
the flexible board extends perpendicular to the first and the second plurality of power terminals and terminates prior to the first and the plurality of power terminals.

21. A method of manufacturing a power semiconductor module, the method comprising:
attaching a power semiconductor die to a metallization layer, the power semiconductor die having a first terminal and a second terminal disposed at a side of the die facing away from the metallization layer;
attaching a first interconnect to the first terminal and a second interconnect to the second terminal;
providing a flexible board that comprises a first metal layer, a second metal layer and an insulator between the first and the second metal layers so that the first and the second metal layers are electrically insulated from one another; and
attaching the first metal layer to the first interconnect and the second metal layer to the second interconnect such that the flexible board is spaced apart from the power semiconductor die by the first and the second interconnects.

* * * * *